(12) United States Patent
Shibata et al.

(10) Patent No.: US 7,213,335 B2
(45) Date of Patent: May 8, 2007

(54) METHOD FOR MANUFACTURING PRINTED CIRCUIT BOARDS

(75) Inventors: Akiji Shibata, Hitachi (JP); Toyoharu Koizumi, Kitaibaraki (JP); Tsuyoshi Ishihara, Tokai (JP); Takashi Sato, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 449 days.

(21) Appl. No.: 10/788,392

(22) Filed: Mar. 1, 2004

(65) Prior Publication Data

US 2004/0172814 A1 Sep. 9, 2004

(30) Foreign Application Priority Data

Mar. 5, 2003 (JP) .............................. 2003-058332

(51) Int. Cl.
*H01K 3/10* (2006.01)
(52) U.S. Cl. .......................... 29/852; 29/825; 29/830; 29/831; 29/846; 174/261; 427/97.2
(58) Field of Classification Search .......... 29/829–834, 29/852, 846, 847; 174/255, 262, 264–265; 427/97.2, 97.5; 156/250, 256; 216/13–20
See application file for complete search history.

(56) References Cited

U.S. PATENT DOCUMENTS

| | | | | |
|---|---|---|---|---|
| 4,908,933 A | * | 3/1990 | Sagisaka et al. ............... | 29/827 |
| 4,915,983 A | * | 4/1990 | Lake et al. .................. | 430/314 |
| 5,665,525 A | * | 9/1997 | Pienimaa ..................... | 430/315 |
| 5,837,154 A | * | 11/1998 | Okabe et al. .................. | 216/14 |
| 6,014,805 A | * | 1/2000 | Buixadera Ferrer .......... | 29/852 |
| 6,981,320 B2 | * | 1/2006 | Ho et al. ....................... | 29/852 |
| 7,013,563 B2 | * | 3/2006 | Durkot ......................... | 29/852 |

FOREIGN PATENT DOCUMENTS

JP 10-12677 1/1998

* cited by examiner

*Primary Examiner*—Minh Trinh
(74) *Attorney, Agent, or Firm*—Antonelli, Terry, Stout & Kraus, LLP.

(57) ABSTRACT

The amount of time required to manufacture double-sided printed circuit boards that contain conductor bridges can be reduced. A method is provided which includes the steps of forming holes which pass through an insulating board and a first conductor layer formed on a first main side of the insulating board, bonding a second conductor layer to a second main side of the insulating board having the holes, forming a third conductor layer on the whole first main side of the insulating board after bonding the second conductor layer, masking preset holes with a plating resist, plating the first conductor and holes in the insulating board, patterning the first conductor layer to form a first conductor pattern, patterning said second conductor layer to form a second conductor pattern, and removing the plating resist and the third conductor layer from an area which is covered with the plating resist.

7 Claims, 5 Drawing Sheets

METHOD FOR MANUFACTURING PRINTED CIRCUIT BOARDS

BACKGROUND OF THE INVENTION

This invention relates to a method for producing a printed circuit board; and, more particularly, to a method of producing a printed circuit board having wirings on both sides of the insulating board, in which part of the wiring passes over holes in the insulating board.

Conventionally, printed circuit boards comprise a film-like insulating board and a conductor (wiring) pattern printed on the insulating board. Some of them have a conductor pattern on each side of the insulating board. The conductor patterns on both sides of the insulating board are electrically interconnected by means of via-elements and plated through-holes (PTH) formed along via-holes and through-holes in the insulating board.

Some of such double-sided printed circuit boards contain, for example, holes different from the via-holes and the through-holes on the insulating board, and part of the conductor patterns on them pass over so as to bridge the holes in the insulating boards. In the following description, holes to be used as the via-elements and the plated through-holes are termed primary holes, and the other holes are termed secondary holes.

Portions of said conductor patterns that pass over the secondary holes of the insulating board are, for example, are electrically connected to external pins of a semiconductor chip to be mounted on the printed circuit board. In the following description, the portions that pass over holes in the printed circuit board are termed conductor bridges.

One method of manufacturing double-sided printed circuit boards having such conductor bridges comprises, for example, the steps of forming a conductor pattern on the first main side of the insulating board, forming holes in the insulating board by laser etching, and forming a conductor pattern on the side (the second main side) opposite to the first main side of the insulating board. (Japanese Application Patent Laid-Open Publication No. Hei 10-12677 (FIG. 1 to FIG. 3; hereinafter, Patent Document 1)

In summary, the method of manufacturing printed circuit boards as disclosed in Patent Document 1 comprises the steps of bonding a conductor film, such as a copper foil, to each side of an insulating board, such as a polyimide sheet, forming via-elements and plated through-holes in the insulating board to electrically interconnect the conductor films on both sides of the insulating board, patterning one of the conductor films to form a first conductor pattern on the insulating board, applying laser beams, such as from a carbon dioxide laser, onto the first conductor pattern layer to etch and form secondary holes (device holes) in the insulating board, and then patterning the other conductor film to form a second conductor pattern having conductor bridges.

Besides the above-described laser-etching method disclosed in Patent Document 1, the secondary holes (device holes) can be formed on the insulating board also by an alkaline etching process, which uses an alkaline solution. However, the types and dimensions of insulating boards to which the alkaline etching is applicable are limited. Further, alkaline etching has some disadvantages, such as low dimensional stability and low shape accuracy of the holes, and it uses a highly-toxic etching solution.

However, although the above-described method can solve problems that the alkaline etching has by forming secondary holes (device holes) in the insulating board by laser etching, it takes a lot of time to etch and form big holes, such as device holes.

Further, in the conventional method of manufacturing printed circuit boards, a long processing time, a high maintenance cost (on a laser oscillator), and a resulting high manufacturing cost can not be avoided.

SUMMARY OF THE INVENTION

An object of this invention, for manufacturing double-sided printed circuit boards having conductor bridges, is to provide a technique to reduce the time required for manufacture.

Another object of this invention, for manufacturing double-sided printed circuit boards having conductor bridges, is to provide a technique both to reduce the time required for manufacture and to reduce the manufacturing cost.

The above and other objects and advantages of the present invention will be apparent upon consideration of the following detailed description, taken in conjunction with the accompanying drawings.

This invention to be disclosed in this application is outlined below.

A method for producing a printed circuit board comprising the steps of forming a first conductor pattern on a first main side of an insulating board, forming a second conductor pattern which is electrically connected to said first conductor pattern on a side (hereinafter termed a second main side) opposite to said first main side of said insulating board, and forming holes in preset areas of said insulating board, wherein the step of forming the second conductor pattern forms the seconds conductor pattern so that part of said pattern may pass over the holes in the insulating board. The method further comprises the steps of forming holes which pass through said insulating board and said first conductor layer formed on the first main side of the insulating board, bonding a second conductor layer to the second main side of the insulating board having said holes, forming a third conductor layer on the whole first main side of said insulating board after bonding the second conductor layer, masking preset holes among those formed by said hole forming process with a plating resist, plating said first conductor and holes in said insulating board, patterning said first conductor layer to form a first conductor pattern, patterning said second conductor layer to form a second conductor pattern, and removing said plating resist and said third conductor layer from an area which is covered with the plating resist.

This method enables a single process to form holes for conductors that interconnect layers, such as via-elements and plated through-holes and other holes, such as holes for providing conductor bridges. This can reduce the time required for production of said printed circuit boards.

Further, the hole forming process uses punching by a die assembly. This can make the board manufacturing cost less than that of the manufacturing method disclosed in Patent Document 1. Further, this process can produce higher dimensional stability of holes and higher manufacturing safety than the alkaline etching process.

The manufacturing method of this invention first forms conductive layers on the insulating board, applies a plating resist onto the layers, and then plates. This can prevent the plating resist from being coated with unwanted plating.

Accordingly, the plating resist can be removed easily. Consequently, printed circuit boards can be manufactured efficiently.

It is possible to prevent the second conductor pattern which is bonded to said insulating board from being etched by forming the second conductor pattern after covering the predetermined holes (or holes for forming conductor bridges). Since the conductor layer on areas covered with the plating resist is very thin, the second conductor pattern is hardly affected by removal of the layer.

Further, the conductor layer forming process employs a direct plating system (DPS) or electroless plating to form conductor layers.

BRIEF DESCRIPTION OF THE DRAWINGS

FIG. 4 (a) shows a sectional view of the printed circuit board in the hole forming process. FIG. 4 (b) shows a sectional view of the printed circuit board in the process of attaching the second conductor layer.

FIG. 5 (a) shows a sectional view of the printed circuit board in the process of making it conductive. FIG. 5 (b) shows a sectional view of the printed circuit board in the process of applying a plating resist.

FIG. 6 (a) shows a sectional view of the printed circuit board in the process of forming via-elements. FIG. 6 (b) shows a sectional view of the printed circuit board in the patterning process.

FIG. 7 (a) shows a sectional view of the printed circuit board in the process of removing the plating resist. FIG. 7 (b) shows a sectional view of the printed circuit board in the process of removing the conductive layer.

DESCRIPTION OF THE INVENTION

Figure 1:
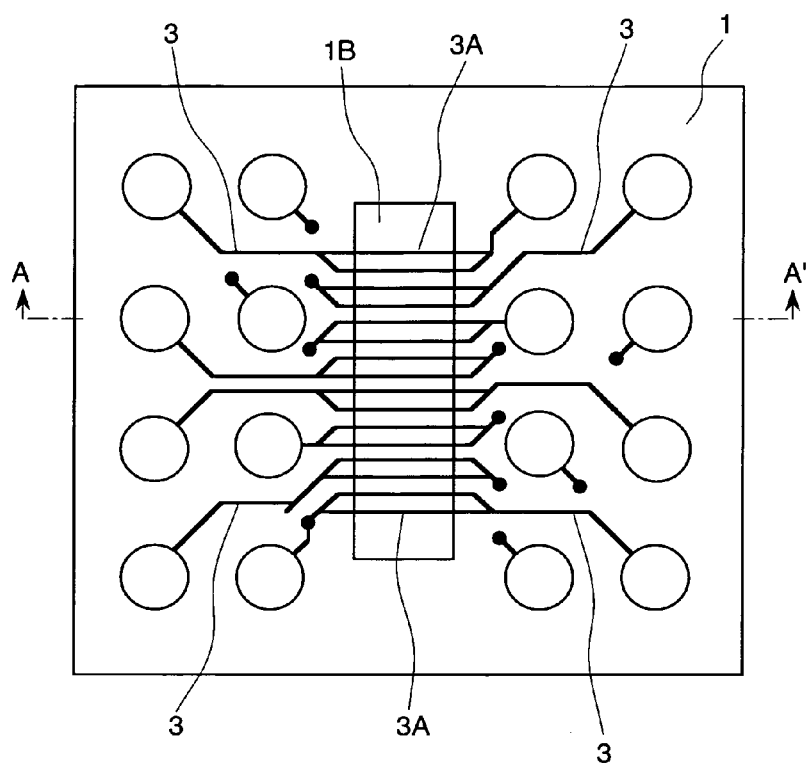
FIG. 1 is a pattern diagram of a printed circuit board related to this invention, and it shows an example of a printed circuit board having conductor bridges.

This invention will be described in further detail by way of various embodiments with reference to the accompanying drawings. In the drawings like reference numerals designate identical or corresponding functional parts throughout the views.

The general configuration of a printed circuit board that is related to this invention will be explained below before presenting an explanation of a preferred embodiment of this invention.

Figure 2:
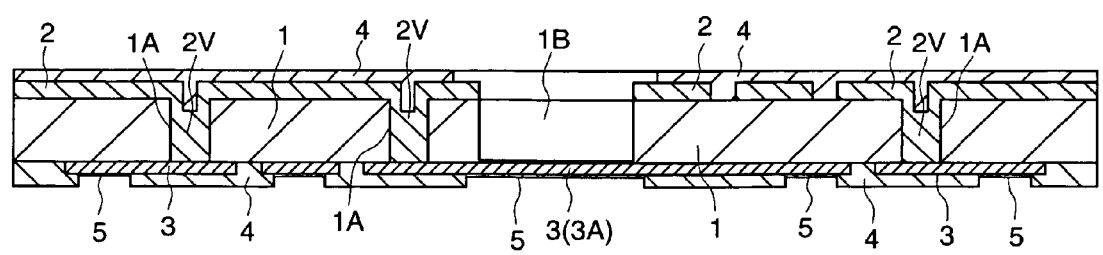
FIG. 2 is a diagrammatic sectional view of a printed circuit board taken on line A-A' of FIG. 1.

FIG. 1 and FIG. 2 are diagrams of a printed circuit board in accordance with this invention. FIG. 1 shows a plane view of a printed circuit board having conductor bridges, and FIG. 2 shows a sectional view taken on line A-A' of FIG. 1.

For example, as shown in FIG. 1 and FIG. 2, the printed circuit board related to this invention comprises a film-like insulating board 1 having a first conductor pattern 2 on the first main side of the board 1 and a second conductor pattern 3 on the side (called a second main side) opposite to the first main side. For example, as shown in FIG. 2, the first conductor pattern 2 and the second conductor pattern 3 are electrically interconnected by means of via-elements 2V along holes (blind via-hole) 1A in the insulating board 1.

Further, the insulating board 1 has a hole 1B (device hole) which is different from the via-holes 1A. Conductor portion 3A of the second conductor pattern 3 runs over and bridges the hole 1B. In the description below, the via-hole 1A is referred to as a primary hole and the hole over which the conductors 3A bridge is referred to as a secondary hole. Conductor portion 3A of the second conductor pattern 3, which passes over the hole 1B, is referred to as a conductor bridge.

The conductor bridges 3A are to be electrically connected to external pins of a semiconductor chip when the chip is mounted on the printed circuit board. The conductor bridges 3A are cut above the secondary hole 1B in the insulating board when the semiconductor chip is mounted on the insulating board, and either or both of the cut pieces of the conductor bridges 3A are connected to the external pins of the semiconductor chip.

The first and second conductor patterns 2 and 3 are coated with a protective layer, such as solder resist, or a functional plating 5, such as gold or tin plating.

A method of manufacturing a printed circuit board representing an embodiment of this invention will be explained using the printed circuit board of FIG. 1 and FIG. 2 as an example.

Figure 3:
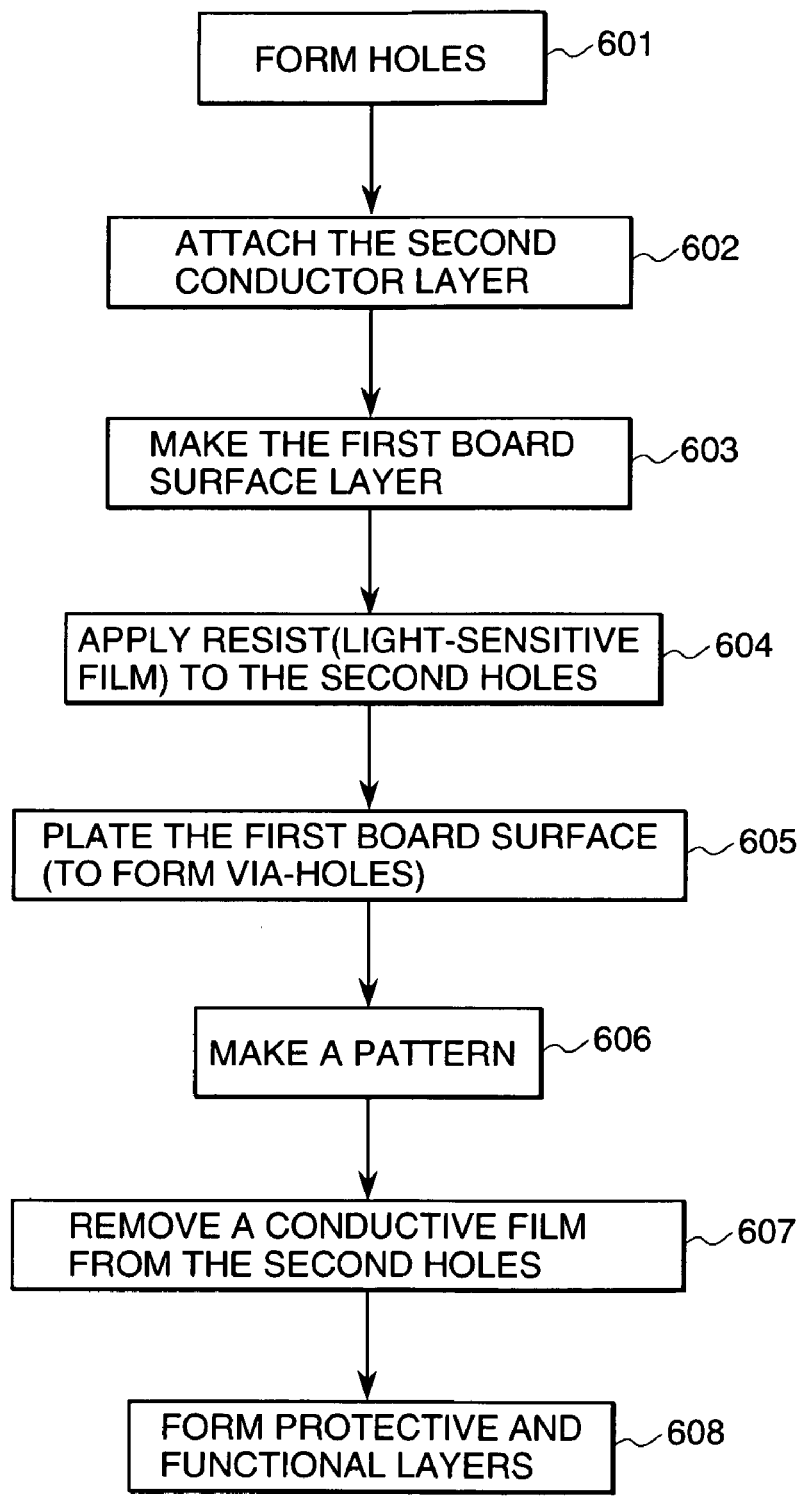
FIG. 3 is a process flow diagram showing a method of manufacturing a printed circuit board according to an embodiment of this invention.
Figure 4A:
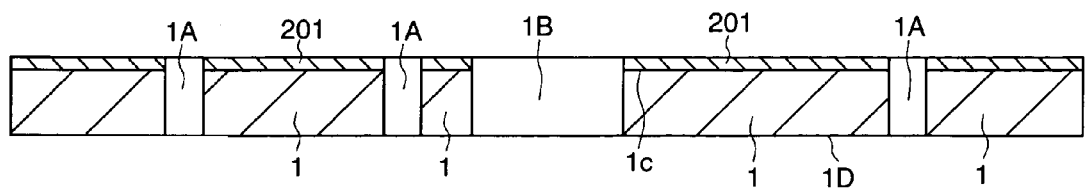
FIG. 4 (a) and FIG. 4 (b) are diagrammatic sectional views illustrating a method of manufacturing a printed circuit board.
Figure 4B:
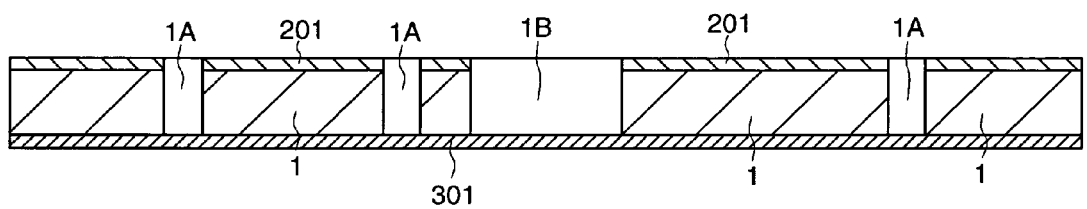
Figure 5A:
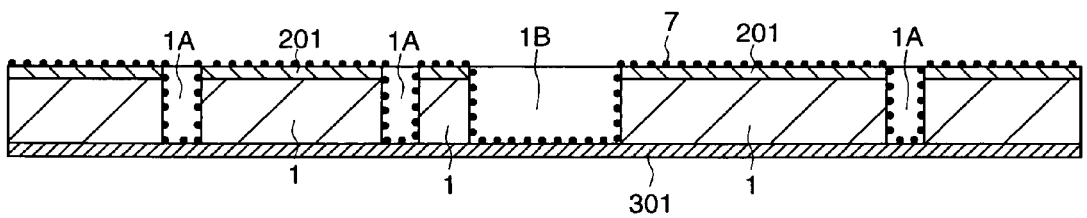
FIG. 5 (a) and FIG. 5 (b) are diagrammatic sectional views illustrating a method of manufacturing a printed circuit board.
Figure 5B:
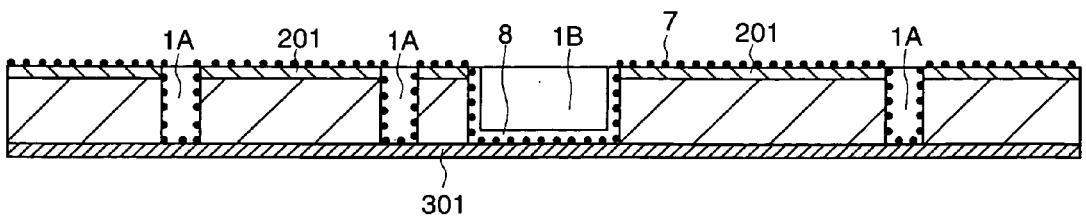
Figure 6A:
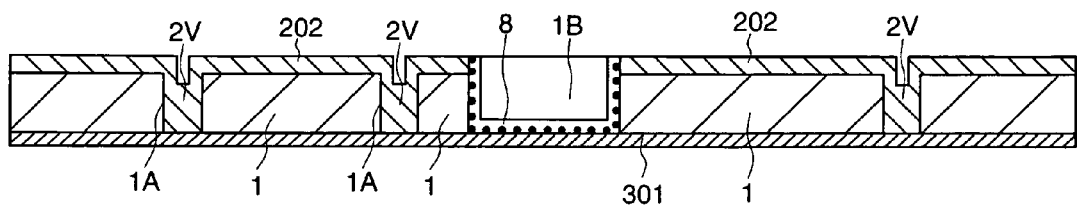
FIG. 6 (a) and FIG. 6 (b) are diagrammatic sectional views illustrating a method of manufacturing a printed circuit board.
Figure 6B:
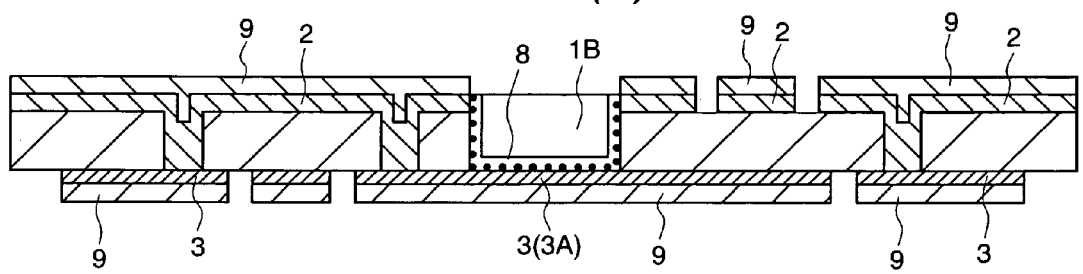
Figure 7A:
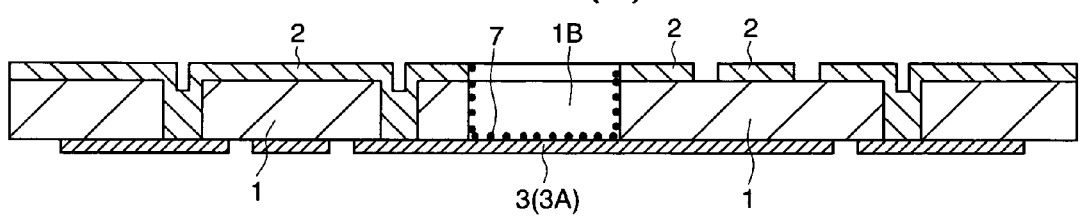
FIG. 7 (a) and FIG. 7 (b) are diagrammatic sectional views illustrating a method of manufacturing a printed circuit board.
Figure 7B:
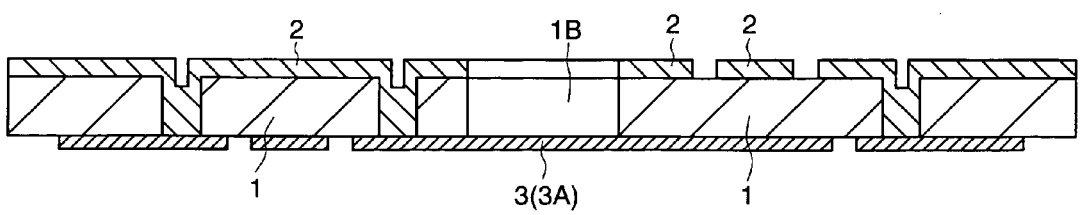

FIG. 3 is a process flow diagram for use in explaining the manufacturing procedure. FIG. 4 (a) is a sectional view of the printed circuit board as seen during the hole forming process. FIG. 4 (b) is a sectional view of the printed circuit board as seen in the process of attaching the second conductor layer. FIG. 5 (a) is a sectional view of the printed circuit board as seen in the process of making it conductive. FIG. 5 (b) is a sectional view of the printed circuit board as seen in the process of applying a plating resist. FIG. 6 (a) is a sectional view of the printed circuit board as seen in the process of forming via-elements. FIG. 6 (b) is a sectional view of the printed circuit board as seen in the patterning process. FIG. 7 (a) is a sectional view of the printed circuit board as seen in the process of removing the plating resist. FIG. 7 (b) is a sectional view of the printed circuit board as seen in the process of removing the conductive layer. The sectional views of FIG. 4 (a) to FIG. 7 (b) are similar to the sectional view of FIG. 2.

As shown in FIG. 3, the method of manufacturing printed circuit boards according to this embodiment comprises a step 601 of forming holes which pass through said insulating board and the first conductor layer that is formed on the first main side of the insulating board; a step 602 of bonding a second conductor layer to the second main side of the insulating board having the holes formed therein; a step 603 of making the whole first main side of the insulating board conductive; a step 604 of masking preset holes (secondary hole) with a plating resist among those holes formed by the hole forming step 601; a step 605 of plating the first conductor layer and the insides of the holes (primary holes) in said insulating board; a step 606 of patterning to form first and second conductor patterns; a step 607 of removing the plating resist and the conductor layer from the secondary holes; and a step 608 of forming a protective layer and a functional plating.

In the production of a printed circuit board of FIG. 1 and FIG. 2 in accordance with this invention, first, the hole forming step 601 is implemented to bond the first conductor layer 201 to the first main side 1C only of a film-like insulating board 1, as shown in FIG. 4 (*a*), and to form the primary holes 1A and the secondary holes 1B. The insulating board 1 is, for example, a polyimide sheet of about 50 microns thick. The first conductor layer 201, is for, example a copper foil of about 12 microns thick. The side 1D (second main side) opposite to the first main side 1C of the insulating board 1 is coated in advance with a resin (B-stage resin) which is hardened halfway (which is not shown in the drawing). The primary holes 1A and the secondary holes 1B are formed, for example, by punching with a die assembly.

Then, the conductor layer bonding step 602 is implemented to bond the second conductor layer 301 to the second main side 1D of the insulating board 1, as shown in FIG. 4 (*b*). The second conductor layer 301, is for example, a copper foil of about 18 microns thick.

Next, the conducting step 603 is implemented to form a thin conductive layer 7 on the whole surface of the first main side of the insulating board 1 so as to make the first main side conductive, as shown in FIG. 5 (*a*). The conductive layer 7 is formed, for example, by a direct plating system (DPS) or electroless plating. The conductive layer 7 is formed not only on the surface of the first conductor layer 201, but also on that whole side of the insulating board 1. Thus, the layer 7 is also formed on the insides of the primary and secondary holes 1A and 1B.

Next, the masking step 604 is implemented to apply a plating resist 8 to cover the preset holes, for example, the secondary holes 1B, as shown in FIG. 5 (*b*). The secondary holes 1B to be covered with the plating resist 8 are for provision of the conductor bridges 3A.

Next, the plating step 605 is implemented to plate the exposed areas of the conductor layer 7 and form via-element 2V in each of the primary holes 1A. The via-elements 2V are formed, for example, by electric copper-plating. In this case, the first conductor layer 201 is also plated slightly. Therefore, the conductor layer on the first main side of the insulating board 1 becomes a laminated conductor layer 202 (comprising the first conductor layer and a plate layer on it).

Next, the patterning step 606 is implemented to form etching resist 9 on the second conductor layer 301 and on the laminated conductor layer 202 comprising the first conductor layer 201, the conductor layer 7, and the plating, as shown in FIG. 6 (*b*), remove unwanted portions from the laminated conductor layer 202 to form the first conductor pattern 2, and remove unwanted portions from the second conductor layer 3 to form the second conductor pattern 3. As shown in FIG. 6 (*b*), the patterning step 606 is implemented with the plating resist 8 that is formed to prevent etching of the area equivalent to the bottom of the secondary hole 1B in the second conductor 3.

The steps of forming the first conductor pattern 2 and the second conductor pattern 3 can be implemented at the same time or separately, as shown in FIG. 6 (*b*).

When the etching resist 9 and the plating resist 8 are removed, the conductor layer 7 is left on the surface of the secondary hole 1A, which was covered with the plating resist 8, as shown in FIG. 7 (*a*). In this status, the conductor layer 7 short-connects the conductor bridge 3A to the first conductor pattern 2 and this prevents formation of a circuit. The conductor layer removing step 607 is implemented to remove this unwanted layer 7 from the secondary hole 1B as shown in FIG. 7 (*b*).

Then, a step 608 is implemented for forming a protective layer and a functional plating. This step forms a protective layer 4, such as solder resist, and a functional plating 5, such as gold plating or tin plating, on the surfaces of the first and second conductor patterns 2 and 3. With this, printed circuit board of FIG. 1 and FIG. 2 is obtained.

As explained above, the method used for manufacturing printed circuit boards in accordance with this invention can form the secondary holes 1B for conductor bridges 3A and the primary holes 1A, such as via-holes and through-holes, to provide conductors for interconnection of layers in a single process. This can reduce the amount of time required to manufacture double-sided printed circuit boards.

Further, the hole forming process 601 to form the primary holes 1A and the secondary holes 1B uses punching with a die assembly. For example, this can make the board manufacturing cost less than that of the manufacturing method disclosed in Patent Document 1. Further, this process can have higher dimensional stability of holes and higher manufacturing safety than that provided by the conventional alkaline etching process.

In other words, the method used for manufacturing printed circuit boards in accordance with this invention can reduce both the board production time and the board production cost more than the conventional board production method.

In general, the plating resist 8 is apt to be separated in the conductive layer forming process. However, since the method of this invention forms the conductive layer 7, the plating resist 8, and a plating layer in that order, this method can mask holes 1B coated with the plating resist 8 without fail. Further, the plating resist 8 can be removed easily, since no plating is formed on the plating resist 8. This can increase the production efficiency of the printed circuit boards.

Furthermore, since the method of this invention forms the secondary conductor pattern 3 while the secondary holes 1B for conductor bridges 3A are covered with the plating resist 8, the bonding area between the second conductor pattern 3 and the insulating board 1 can be protected against etching. Since the conductor layer 8 on areas covered with the plating resist is very thin, the second conductor pattern is hardly affected by removal of the layer.

Figure 8:
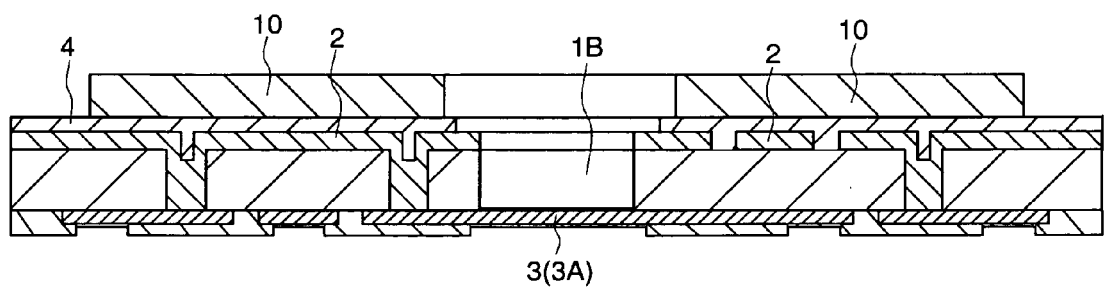
FIG. 8 is a diagrammatic sectional view illustrating an application of the printed circuit board manufacturing method of this invention.

FIG. 8 shows a sectional view of the printed circuit board to illustrate an application of the printed circuit board manufacturing method of this invention.

Although the foregoing embodiment has been described using the method of manufacturing a printed circuit board of FIG. 1 and FIG. 2, as an example, it is possible to apply, for example, an adhesive to bond a semiconductor chip or an elastic material 10 for stress buffering to the semiconductor chip site, as shown in FIG. 8, after manufacturing the printed circuit board in accordance with the above procedure.

The preferred embodiment has been described to illustrate the invention. However, it is to be understood that this embodiment is intended to illustrate the invention and is not to be considered to limit the scope of the invention. Variations may be made by one skilled in the art without departing from the spirit and scope of this invention.

For example, the above-described embodiment is directed to a method of manufacturing the printed circuit board of FIG. 1 and FIG. 2. However, it is to be understood that the invention is applicable in general to double-sided printed circuit boards having conductor bridges 3A. In this case, one end of the conductor bridge 3A can be, for example, on the primary hole 1A.

Furthermore, the conductor bridges 3A need not be those to be connected, for example, to external pins of the semiconductor chip and can be conductors, such as high-frequency transmission paths, passing over holes formed to prevent the influence of dielectric constants of the insulating board.

Representative features disclosed by this application mainly have the following effects:

(1) This invention can reduce the amount of time required to manufacture double-sided printed circuit boards that contain conductor bridges.

(2) This invention can reduce both the time and the cost required to manufacture double-sided printed circuit boards that contain conductor bridges.

What is claimed is:

1. A method for producing a printed circuit board comprising the steps of:

forming a first conductive layer on a first main side of an insulating board, forming holes through preset areas of said insulating board and said first conductive layer formed on the first main side of the insulating board, bonding a second conductive layer to a second main side of said insulating board, said second conductive layer passing over said holes, the second main side being opposite to the first main side, forming a third conductive layer on the whole first main side of said insulating board and in said holes after said bonding of said second conductive layer, masking the third conductive layer in at least one of said holes with a plating resist, plating a plate layer on exposed portions of said third conductive layer, patterning said first conductive layer to form a first conductor pattern, patterning said second conductive layer to form a second conductor pattern, and removing said plating resist and said third conductive layer from an area which had been covered with said plating resist.

2. The method for producing a printed circuit board according to claim 1, wherein said masking step is performed after said step of forming said third conductive layer.

3. The method for producing a printed circuit board according to claim 2, wherein said step of forming holes comprises punching out holes with a die assembly.

4. The method for producing a printed circuit board according to claim 1, wherein said step of forming holes comprises punching out holes with a die assembly.

5. The method according to claim 1, wherein said at least one of said holes is larger than other of said holes.

6. The method according to claim 5, wherein said at least one of said holes is a hole in which a semiconductor cap is mounted.

7. The method according to claim 1, further comprising a semiconductor chip mounted in said at least one of said holes.

* * * * *